(12) United States Patent
Graham et al.

(10) Patent No.: US 7,749,603 B2
(45) Date of Patent: Jul. 6, 2010

(54) TWO-LAYER TRANSPARENT ELECTROSTATIC CHARGE DISSIPATING COATING

(75) Inventors: Charles R. Graham, St. Peters, MO (US); Patrick J. Kinlen, Fenton, MO (US); Tony D. Flaim, St. James, MO (US)

(73) Assignees: Lumimove, Inc., St. Louis, MO (US); Brewer Science, Inc., Rolla, MO (US)

( * ) Notice: Subject to any disclaimer, the term of this patent is extended or adjusted under 35 U.S.C. 154(b) by 31 days.

(21) Appl. No.: 12/069,457

(22) Filed: Feb. 11, 2008

(65) Prior Publication Data

US 2009/0074973 A1    Mar. 19, 2009

Related U.S. Application Data

(60) Provisional application No. 60/900,862, filed on Feb. 12, 2007, provisional application No. 60/927,236, filed on May 2, 2007.

(51) Int. Cl.
*B32B 27/00* (2006.01)
*B32B 5/00* (2006.01)
*B32B 27/38* (2006.01)
*B05D 3/00* (2006.01)
*B05D 1/36* (2006.01)

(52) U.S. Cl. .................. 428/411.1; 428/336; 428/500; 428/704; 427/331; 427/407.1

(58) Field of Classification Search ............. 428/411.1, 428/336, 500, 704, 413, 423.1; 427/331, 427/407.1
See application file for complete search history.

(56) References Cited

U.S. PATENT DOCUMENTS

| 4,691,005 | A | 9/1987 | Sato et al. ............ 528/380 |
|---|---|---|---|
| 4,929,389 | A | 5/1990 | Aldissi ............ 252/500 |
| 5,276,102 | A | 1/1994 | Rossi et al. ............ 525/327.2 |
| 5,328,961 | A | 7/1994 | Rossi et al. ............ 525/206 |
| 5,370,825 | A | 12/1994 | Angelopoulos et al. ..... 252/500 |
| 5,750,637 | A | 5/1998 | Takiguchi et al. ............ 528/310 |
| 6,010,645 | A | 1/2000 | Angelopoulos et al. ..... 252/500 |
| 6,103,145 | A | 8/2000 | Angelopoulos et al. ..... 252/500 |
| 6,146,753 | A | 11/2000 | Niimi et al. ............ 428/332 |
| 6,404,120 | B1 | 6/2002 | Aben et al. ............ 313/479 |
| 6,503,627 | B1 | 1/2003 | Niimi et al. ............ 428/409 |
| 6,830,708 | B2 | 12/2004 | Angelopoulos et al. ..... 252/500 |
| 7,014,912 | B2 | 3/2006 | Suzuki et al. ............ 428/208 |
| 7,166,241 | B1 | 1/2007 | Angelopoulos et al. ..... 252/500 |
| 7,410,825 | B2* | 8/2008 | Majumdar et al. ......... 438/106 |
| 2003/0164427 | A1 | 9/2003 | Glatkowski et al. |
| 2004/0067703 | A1 | 4/2004 | Grunden et al. |
| 2005/0042556 | A1 | 2/2005 | Louwet et al. |
| 2005/0230560 | A1 | 10/2005 | Glatkowski et al. |
| 2006/0029818 | A1 | 2/2006 | Suzuki et al. |

OTHER PUBLICATIONS

PCT International Preliminary Report on Patentability, date of submission of the demand Aug. 20, 2008, date of completion of report Sep. 2, 2009, date of mailing Sep. 17, 2009, IPEA/US, International Application No. PCT/US08/01771, International Filing Date Feb. 11, 2008, Applicant Charles R. Graham.
International Search Report and Written Opinion, completed Apr. 29, 2008 and mailed May 22, 2008, International Application No. PCT/US08/01771.
Sherwin Williams, Chemical Coatings CC-D12, Polane® Clear Topcoat, CC-D12 2000490 Oct. 1997.
Sartomer, Product Bulletin: SARCURE SR1122, Typical Physical and Chemical Properties, ATOFINA 2737 Sep. 2002.
Sartomer, Application Bulletin: Surface Tensions of Sartomer Monomers, Total 4024 Dec. 2004.
Rohm Haas Textiles and Nonwovens, RHOPLEX® HA-16, Self-crosslinking Acrylic Emulsion for Textiles, ©Rohm and Haas Company, 1996, 2OTU, Mar. 1995.
ACOTA-Spheracote Group, Products, Novec FC4430 Fluorosurfactant in 18.1 kg, Content © Acota Ltd 2003, Powered by uCommerce XP.

* cited by examiner

*Primary Examiner*—Thao T. Tran
(74) *Attorney, Agent, or Firm*—Nelson Mullins Riley & Scarborough, LLP

(57) ABSTRACT

A transparent two-layer electrostatic dissipating coating includes a first layer comprising a transparent first binder polymer and a first intrinsically conducting polymer (ICP) in an amount sufficient to provide the first layer with a surface resistance of from about $10^3$ to about $10^5 \Omega/\square$; and a second layer in direct contact with the first layer and comprising a transparent second binder polymer and a second ICP in an amount sufficient to provide the second layer with a surface resistance of from about $10^6$ to about $10^{10} \Omega/\square$, wherein the coating has a light transmission of at least about 70% at a wavelength of 600 nm. Methods of making and using the coating are also described.

24 Claims, 1 Drawing Sheet

TWO-LAYER TRANSPARENT ELECTROSTATIC CHARGE DISSIPATING COATING

CROSS-REFERENCES TO RELATED APPLICATIONS

This application is a non-provisional of and claims priority to U.S. Provisional Patent Application No. 60/900,862, filed Feb. 12, 2007, and to U.S. Provisional Patent Application No. 60/927,236, filed May 2, 2007.

STATEMENT OF GOVERNMENT SUPPORT

This invention was made with Government support under Contract Award N00421-03-C-0132 awarded by Naval Air Systems Command (NAVAIR), Naval Air Warfare Center, Patuxent River, Md. The Government has certain rights in the invention.

BACKGROUND OF THE INVENTION (1) Field of the Invention

The present invention relates to transparent coatings for the dissipation of electrostatic charge, and more particularly to two-layer transparent coatings for the dissipation of electrostatic charge.

(2) Description of the Related Art

Many applications require coatings that dissipate electrostatic charge and many such coatings are known in the art. Most of these coatings contain some type of electrically conductive material, such as metal particles, and are opaque. However, when the surface that is to be protected from charge build up is transparent, such as a window, a computer screen, television screen, optical lens, lenses of eyeglasses, instrument covers, airplane canopies, or the like, the electrostatic dissipating (ESD) coating must also be transparent.

In the case of airplane canopies, it is not uncommon for several coatings to be applied, each designed for a different purpose. For example sputtered coatings of indium tin oxide (ITO), aluminum tin oxide, gold, or silver can act as a shield from electromagnetic interference, tie-coats of polymers can facilitate adhesion of non-compatible coatings, and hard coats provide the exterior surface of the canopy with durability and abrasion resistance.

Aircraft canopies must be able to dissipate electrostatic charge that is generated triboelectrically during flight. Since canopies are made of insulating plastics such as polycarbonate and polyacrylic, electrostatic charge builds up and may take minutes to hours to dissipate. The charge accumulated in flight is dangerous to pilots, maintenance personnel, and delicate on-board electronic equipment and may pose a potential explosion hazard. The deposition of transparent, sputtered ITO films onto the canopy surface has been the principal means for alleviating problems with charge build-up. However, sputtered films are inflexible and fragile as well as being susceptible to degradation by UV light, which is very intense in the upper atmosphere. Moreover, when the canopy has a metal-containing electromagnetic shielding layer covered with a non-conductive hard coat, arcing of electrostatic charge through the hard coat to the electromagnetic shielding layer can cause visible pinholes or pits in the coatings, which eventually compromise the optical qualities of the canopy and make replacement necessary. The aerospace industry needs a highly transparent ESD film that is easy to apply, flexible, adherent and stable to the extreme environments to which aircraft are exposed.

The prior art describes several ESD coatings that are designed for use over transparent substrates. Some of these coatings are designed to be applied in a single layer, for example, US 2003/0164427 A1 and US 2005/0230560 A1 describe coatings that contain carbon nanotubes. Other prior art ESD coatings can employ two or more layers, for example, US 2005/0042556 A1 describes a coating system employing a first layer comprising an intrinsically conductive polymer and a second layer consisting of a non-continuous layer of conductive silver. Coatings that are formed on transparent films are described in U.S. Pat. Nos. 6,146,753, 6,503,627, 7,014,912, and in US 2006/0029818 A1. In the first two of these, Niimi et al. describe a three part coating comprising a transparent substrate film on which is deposited a conducting layer, which can contain an intrinsically conductive polymer, over which is placed a hard coat having anisotropic electrical conductivity that is preferably obtained by constructing the layer with conductive fine particles having a diameter not less than ⅓ the thickness of the layer. In U.S. Pat. No. 7,014,912, and in US 2006/0029818 A1 Suzuki et al. describe a four part coating having a structure that is similar to that described above, but further having a top coat with a lower index of refraction than the hard coat to provide a low reflective antistatic hardcoat film.

It would be useful to provide a coating for an aircraft canopy, or indeed for any substrate on which a transparent ESD coating is useful, that could be applied directly to the substrate to be protected without the use of an intervening support film. It would be useful if the coating would be capable of effectively dissipating an electrostatic charge, but also had high visible light transmittance. In addition, it would be useful if such a coating exhibited good performance in the areas of coating adhesion to the substrate, flexibility, abrasion resistance, and chemical resistance.

SUMMARY OF THE INVENTION

Briefly, therefore the present invention is directed to a novel transparent two-layer electrostatic dissipating coating comprising: a first layer comprising a transparent first binder polymer and a first intrinsically conducting polymer (ICP) in an amount sufficient to provide the first layer with a surface resistance of from about $10^3$ to about $10^5 \Omega/\square$; and a second layer in direct contact with the first layer and comprising a transparent second binder polymer and a second ICP in an amount sufficient to provide the second layer with a surface resistance of from about $10^6$ to about $10^{10} \Omega/\square$, wherein the coating has a light transmission of at least about 70% at a wavelength of 600 nm.

The present invention is also directed to a novel method of making a transparent two-layer electrostatic dissipating coating on a surface of a substrate comprising: forming on the surface a first layer comprising a transparent first binder polymer and a first intrinsically conducting polymer (ICP) in an amount sufficient to provide the first layer with a surface resistance of from about $10^3$ to about $10^5 \Omega/\square$; and forming a second layer on the first layer and in direct contact with the first layer and comprising a transparent second binder polymer and a second ICP in an amount sufficient to provide the second layer with a surface resistance of from about $10^6$ to about $10^{10} \Omega/\square$, wherein the coating has a light transmission of at least about 70% at a wavelength of 600 nm.

The present invention is also directed to a novel method of dissipating electrostatic charge from a transparent substrate, the method comprising applying to a surface of the substrate a transparent two-layer electrostatic dissipating coating comprising: a first layer comprising a transparent first binder polymer and a first intrinsically conducting polymer (ICP) in an amount sufficient to provide the first layer with a surface resistance of from about $10^3$ to about $10^5 \Omega/\square$; and a second layer in direct contact with the first layer and comprising a transparent second binder polymer and a second ICP in an amount sufficient to provide the second layer with a surface resistance of from about $10^6$ to about $10^{10} \Omega/\square$, wherein the coating has a light transmission of at least about 70% at a wavelength of 600 nm.

The present invention is also directed to a novel transparent substrate having protection against accumulation of electrostatic charge, comprising: a surface of the substrate, to which is adhered a coating comprising; a first layer comprising a transparent first binder polymer and a first intrinsically conducting polymer (ICP) in an amount sufficient to provide the first layer with a surface resistance of from about $10^3$ to about $10^5 \Omega/\square$; and a second layer in direct contact with the first layer and comprising a transparent second binder polymer and a second ICP in an amount sufficient to provide the second layer with a surface resistance of from about $10^6$ to about $10^{10} \Omega/\square$, wherein the coating has a light transmission of at least about 70% at a wavelength of 600 nm.

Among the several advantages found to be achieved by the present invention, therefore, may be noted the provision of a transparent ESD coating that can be applied directly to the substrate to be protected without the use of an intervening support film, and also the provision of such a coating that is capable of effectively dissipating an electrostatic charge, but also had high visible light transmittance, and also the provision of such a coating that exhibits good performance in the areas of coating adhesion to the substrate, flexibility, abrasion resistance, and chemical resistance.

DETAILED DESCRIPTION OF THE PREFERRED EMBODIMENTS

Figure 1:
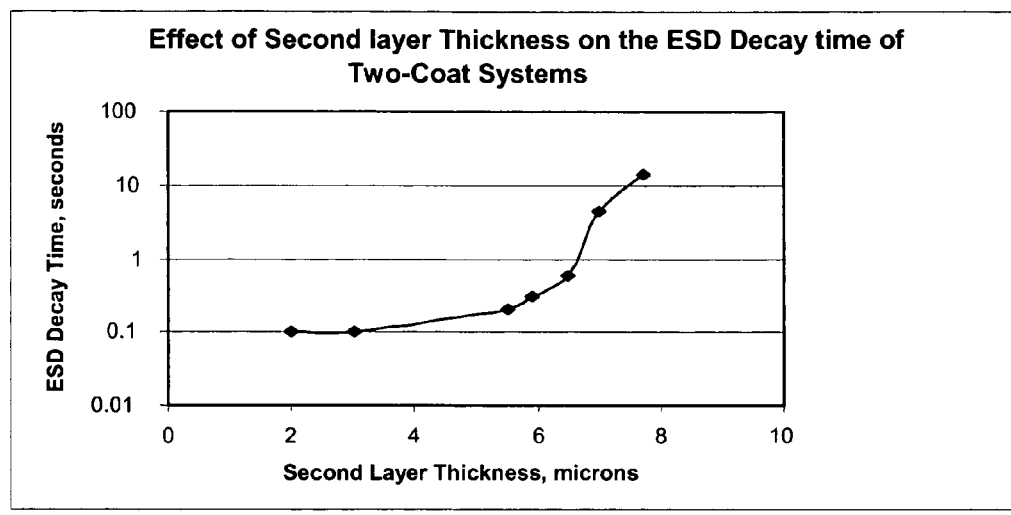
FIG. 1 is a graph showing EDS decay time as a function of the thickness of the second layer for an embodiment of the two layer coating of the present invention.

In accordance with the present invention, it has been discovered that a surface that is in need of protection from accumulation of electrostatic charge, and in particular a surface of a transparent material, can be protected from the accumulation of the electrostatic charge by a novel transparent two-layer electrostatic dissipating coating that includes a first layer comprising a transparent first binder polymer and a first intrinsically conducting polymer (ICP) that is present in an amount sufficient to provide the first layer with a surface resistance of from about $10^3$ to about $10^5 \Omega/\square$; and a second layer in direct contact with the first layer and comprising a transparent second binder polymer and a second ICP that is present in an amount sufficient to provide the second layer with a surface resistance of from about $10^6$ to about $10^{10} \Omega/\square$, and where the coating has a light transmission value at 600 nm of at least about 70%.

The present coating is typically applied to the surface to be protected from electrostatic charge and connected in some way to an electrical ground. Used in this manner, the present coating can serve as a suitable ESD coating for an aircraft canopy that provides excellent discharge characteristics and optical clarity, while also providing excellent stability in the face of environmental weathering, good adhesion characteristics, and good abrasion resistance.

Preferred embodiments of the novel coating have been found to offer performance advantages over present ESD coatings, including greater abrasion and scratch resistance, higher optical transparency while maintaining adequate ESD protection, better interlayer adhesion to reduce cracking and delamination, greater weatherability and resistance to aircraft fluids and cleaning solutions, and easier and safer application with potential for reworking.

The present coating system utilizes a novel double-layer structure in which a thin, electrically-conductive polymer coating serves as both a bonding layer and a grounding plane for a durable polymer top (second) layer that provides abrasion and chemical resistance. The bottom (first) layer can be dissolved in a selective etchant that does not affect the underlying canopy surface. This allows the double-layer coating system to be removed easily for reworking.

Beyond meeting the requirements for extreme durability, the second layer possesses moderate conductivity so that triboelectrically-generated surface charges are transported to the first layer and thence to a grounding point for dissipation. The second layer also permits efficient application by UV-curing methods that release little or no volatile organic compounds and avoid the use of high temperature curing processes that can distort the canopy structure.

The combination of the first layer and the second layer has a light transmission at a wavelength of 600 nm of at least about 70%, preferably at least about 75%, more preferably at least about 80%, yet more preferably at least about 85%, and eve more preferably at least about 90%.

Furthermore, the present coating is easily formulated from readily available materials and can be applied by conventional methods. It is not required that either of the two layers of the present coating has anisotropic conductivity and, in fact, it is preferred that both the first layer and the second layer have isotropic electrical conductivity.

The present coating is applied directly to a substrate or is optionally applied over one or more coatings that have been previously applied to the substrate. In some applications it is preferred that the present coating consists essentially of a first layer and a second layer as defined herein, having no other materials that affect the essential characteristics of the coating. In other applications it is preferred that the present coating solely consists of the first layer and the second layer, as defined herein. Optionally, the second layer of the present coating is overlaid with one or more additional coatings. However, it is preferred that the second layer of the present coating is the final or topmost layer of all coatings on the substrate. When a coating is described herein as being the final or topmost layer of all coatings, what is meant is that the subject coating is the coating last applied and that the second layer of the coating is in contact with the surrounding environment. For example, when the present coating is applied to an aircraft window or canopy, it is preferred that the second layer is the coating in contact with the environment outside the window or canopy enclosure.

In some embodiments where the substrate is a canopy, window, lens, or the like, which has two identifiable surfaces, sometimes designated as "inside" and "outside" surfaces, the present coating optionally is applied to one or both such surfaces.

The present coating can be applied to a surface of any substrate that would benefit from protection from the accumulation of electrostatic charge. However, the coating is particularly useful when the substrate is a transparent material. Any glass or plastic can serve as the substrate, and transparent plastics such as polycarbonates, acrylics, stretched acrylics, and the like, are suitable. Transparent plastics that are known for use in aircraft windows and canopies are particularly useful as the substrate for the present coating.

No particular treatment of the surface of the substrate is required prior to the application of the present coating. Normally, however, it is preferred to clean the surface of all dust, dirt, moisture, grease and oils, and any other foreign matter before applying the coating.

The present coating comprises a first layer and a second layer. The inventors believe that the particular advantages of the coating derive from the combination of the materials that are used in, and the physical and chemical properties of, each of the two layers.

The electrical conductivity of each of the two layers of the present coating can be provided by the inclusion in each layer of an ICP. It is believed that according to the invention, virtually any ICP can be used. As used herein, "ICP" means any intrinsically conducting polymer that is capable of conducting an electrical current in at least one valence state of the polymer. Generally, ICP's are organic polymers that have poly-conjugated pi-electron systems. Examples of suitable ICP's for use in connection with the present invention include polyaniline, polypyrrole, polythiophene, poly(3-alkyl-thiophenes) such as poly(3-hexyl thiophene), poly(3-methyl thiophene), poly(3,4-ethylenedioxythiophene)-polystyrenesulfonate, and poly-(3-octyl thiophene), poly-isothianapthene, poly-(3-thienylmethylacetate), polydiacetylene, polyacetylene, polyquinoline, polyheteroarylenvinylene, in which the heteroarylene group can be thiophene, furan or pyrrole, poly-(3-thienylethylacetate), and the like, and derivatives, copolymers and mixtures thereof. Some ICP's exhibit the electrically conductive property naturally while others must be doped or charged to the proper valence state.

The first layer can be thinner and more electrically conductive than the second layer, but it is not normally as resistant to abrasion or as hard and durable. The first layer has good adhesion to the surface of the substrate and also to the second layer that is applied over it. The first layer comprises a transparent first intrinsically conducting polymer (ICP) and a first binder polymer. It is preferred that the first ICP is present in an amount sufficient to provide the first layer with a surface resistance of from about $10^3$ to about $10^5 \Omega/\square$.

The first layer can be applied as a water-borne formulation. Accordingly, the first ICP is an ICP that is soluble in or dispersible in water or in an aqueous solution. Such ICP's are known in the art and include, without limitation, polyanilines, polypyrroles, and polythiophenes having dopant molecules that increase water solubility. Examples of suitable water soluble or water dispersible ICPs are found in U.S. Pat. Nos. 4,691,005, 4,929,389, 5,276,102, 5,328,961, 5,370,825, 5,750,637, 6,010,645, 6,103,145, 6,830,708 and 7,166,241, among others. A preferred first ICP is poly(ethylenedioxythiophene) doped with poly(styrenesulfonate) (PEDOT-PSS). An example of this ICP is poly(3,4-ethylenedioxythiophene) poly(styrenesulfonate) available commercially under the trade name Baytron® from H. C. Starck, Newton, Mass. Particular examples include Baytron® P HC V4, and Baytron® PH 500.

When the first layer is applied as a water-borne formulation, the first ICP is intermixed with a transparent first binder polymer in water or in an aqueous solution. The formulation can be designed to be either thermally curable or curable by radiation. As used herein, when a binder polymer is described as "transparent", it is meant that a cured 5 micron thick film of the polymer without any additives has a light transmission of at least about 90% at a wavelength of 600 nm.

An example of a water-borne, thermally cured formulation for the first layer includes a self-crosslinking acrylic emulsion, such as is available from Rohm and Hass Company under the tradename Rhoplex® HA-16, as the first binder polymer, and poly(3,4-ethylenedioxythiophene) poly(styrenesulfonate), available commercially under the trade name Baytron® P HC V4, as the first ICP. In addition to water, butyl cellosolve may be added as a co-solvent, diethylene glycol and diethylene glycol monobutyl ether may be added as conductivity enhancers, and a surfactant, such as Dynol® 604, available from Air Products Company, may be added to improve mixing and flow properties. In this example formulation, the first ICP can be present in an amount of from about 5% to about 30% by weight of the solids in the formulation, preferably from about 8% to about 20%, more preferably from about 9% to about 15%, and even more preferably from about 9% to about 12%.

The first layer can also be applied as a water-borne, radiation cured formulation. An example of a water-borne, radiation cured formulation for the first layer includes a self-crosslinking acrylic emulsion, such as is available from Rohm and Hass Company under the tradename Rhoplex® HA-16, as the first binder polymer, and poly(3,4-ethylenedioxythiophene) poly(styrenesulfonate), available commercially under the trade name Baytron® P HC V4, as the first ICP. In addition to water, butyl cellosolve may be added as a co-solvent, diethylene glycol and diethylene glycol monobutyl ether may be added as conductivity enhancers, and a surfactant may be added to improve mixing and flow properties. In order to promote curing by ultraviolet (UV) radiation, the formulation can also contain an acrylic polyurethane emulsion, an example of which is available from DSM NeoResins, Waalwijk, The Netherlands, under the trade name of NeoRad R440, as well as a reactive monomer such as, for example, an ethoxylated trimethylolpropane triacrylate, an example of which is available from Sartomer, Exton, Pa., under the trade name SR415. In this example formulation, the first ICP can be present in an amount of from about 5% to about 30% by weight of the solids in the formulation, preferably from about 8% to about 20%, more preferably from about 9% to about 15%, and even more preferably from about 9% to about 12%.

The formulation for the application of the first layer is typically a liquid having a viscosity sufficient to result in Zahn #2 cup drain times at 25° C. of from about 10 seconds to about 30 seconds, and from 12 to about 18 seconds drain time is preferred. The liquid formulations for the first layer are prepared by any known method, but can be prepared by intermixing the ingredients at room temperature for a time sufficient to provide a homogeneous mixture. Care should be taken to avoid the introduction of bubbles or foam into the formulation. When a catalyst or photoinitiator is included in the formulation, it is typically added close to the time that the formulation is to be applied to a substrate.

The first layer formulation can be applied to a surface of a substrate by any method known in the art, such as, for example, by brushing, spraying, dipping, flow coating, and the like. It is preferred, however, that the first layer formulation is applied to the surface by flow coating.

The first layer formulation is applied to the surface of the substrate in an amount so that it cures to form a first layer having a thickness of from about 0.2 to about 5 microns, preferably from about 0.5 to about 3 microns, more preferably from about 0.5 to about 2 microns, and yet more preferably from about 0.8 to about 1.5 microns.

The amount of the first ICP that is included in the first layer is designed to provide a desired level of electrical conductivity while permitting the coating to retain a desired level of light transmission. It is preferred that the first ICP is present in the first layer in an amount that is sufficient to provide the first layer with a surface resistance of from about $10^2$ to about $10^7 \Omega/\square$, and a surface resistance of from about $10^3$ to about $10^5 \Omega/\square$ is more preferred.

A formulation for the second layer of the present coating is applied directly over the first layer and cures to form the second layer. It is preferred that the first layer is at least partially cured prior to the application of the second layer formulation, and it is more preferred that the first layer is cured before the second layer formulation is applied.

The second layer can be thicker and less electrically conductive than the first layer, and is normally more resistant to abrasion and environmental weathering. The second layer has good adhesion to the first layer. The second layer comprises a second intrinsically conducting polymer (ICP) and a transparent second binder polymer. It is preferred that the second ICP is present in an amount sufficient to provide the second layer with a surface resistance of from about $10^6$ to about $10^{10} \Omega/\square$.

The second layer can also be applied as a water-borne liquid formulation. Like the first ICP, therefore, the second ICP is an ICP that is soluble in or dispersible in water or in an aqueous solution. Such ICP's can include, without limitation, polyanilines, polypyrroles, and polythiophenes having dopant molecules that increase water solubility. A preferred ICP for second layer formulations is poly(ethylenedioxythiophene), and in particular poly(ethylenedioxythiophene) doped with poly(styrenesulfonate) (PEDOT-PSS). An example of this ICP is poly(3,4-ethylenedioxythiophene) poly(styrenesulfonate) available commercially under the trade name Baytron® P HC V4, or Baytron® PH 500, from H. C. Starck, Newton, Mass.

When the second layer is applied as a water-borne formulation, the second ICP is intermixed with a transparent second binder polymer in water or in an aqueous solution. The formulation can be designed to be either thermally curable or curable by radiation.

An example of a water-borne, thermally cured formulation for the second layer includes a self-crosslinking acrylic emulsion, such as is available from Rohm and Hass Company under the tradename Rhoplex® HA-16, as the second binder polymer, and poly(3,4-ethylenedioxythiophene) poly(styrenesulfonate), available commercially under the trade name Baytron® P HC V4, as the second ICP. In addition to water, butyl cellosolve may be added as a co-solvent, diethylene glycol and diethylene glycol monobutyl ether may be added as conductivity enhancers, and a surfactant, such as Dynol® 604, available from Air Products Company, may be added to improve mixing and flow properties. In this example formulation, the second ICP can be present in an amount of from about 1% to about 15% by weight of the solids in the formulation, preferably from about 2% to about 12%, more preferably from about 3% to about 10%, and even more preferably from about 4% to about 10%.

The second layer can also be applied as a water-borne, radiation cured formulation. Binder polymers that are useful for a radiation cured second layer include, without limitation, UV-curable vinyl ether/cycloaliphatic epoxides and self-crosslinking acrylic emulsions. An example of a water-borne, radiation cured formulation for the second layer includes a self-crosslinking acrylic emulsion, such as is available from Rohm and Hass Company under the trade name Rhoplex® HA-16, as the second binder polymer, and poly(3,4-ethylenedioxythiophene) poly(styrenesulfonate), available commercially under the trade name Baytron® P HC V4, as the second ICP. In addition to water, butyl cellosolve may be added as a co-solvent, diethylene glycol and diethylene glycol monobutyl ether may be added as conductivity enhancers, and one or more surfactants (such as, for example, Dynol® 604 and/or a fluorosurfactant available from the 3M Corporation under the trade name FC 4430) may be added to improve mixing and flow properties. In order to promote curing by ultraviolet (UV) radiation, the formulation can also contain an acrylic polyurethane emulsion, an example of which is available from DSM NeoResins, Waalwijk, The Netherlands, under the trade name of NeoRad R440, as well as a reactive monomer such as, for example, an ethoxylated trimethylolpropane triacrylate, an example of which is available from Sartomer, Exton, Pa., under the trade name SR415. In this example formulation, the second ICP can be present in an amount of from about 1% to about 15% by weight of the solids in the formulation, preferably from about 2% to about 12%, more preferably from about 3% to about 10%, and even more preferably from about 4% to about 10%.

The formulation for the application of the second layer is typically a liquid having a viscosity sufficient to result in Zahn #2 cup drain times at 25° C. of from about 15 seconds to about 30 seconds, and from 15 to about 20 seconds drain time is preferred. The liquid formulations for the second layer are prepared by any known method, but can be prepared by intermixing the ingredients at room temperature for a time sufficient to provide a homogeneous mixture. Care should be taken to avoid the introduction of bubbles or foam into the formulation. When a catalyst or photoinitiator is included in the formulation, it is typically added close to the time that the formulation is to be applied to a substrate.

The second layer formulation can be applied over a first layer by any method known in the art, such as, for example, by brushing, spraying, dipping, flow coating, and the like. It is preferred, however, that the second layer formulation is applied by flow coating.

The second layer formulation is applied over the first layer in an amount so that it cures to form a second layer having a thickness of from about 2 to about 15 microns, preferably from about 2 to about 10 microns, more preferably from about 3 to about 8 microns, and yet more preferably from about 3 to about 5 microns.

The amount of the second ICP that is included in the second layer is designed to provide a desired level of electrical conductivity while retaining a desired level of light transmission. It is preferred that the second ICP is present in the second layer in an amount that is sufficient to provide the second layer with a surface resistance of from about $10^5$ to about $10^{12} \Omega/\square$, or more preferably from about $10^6$ to about $10^{10} \Omega/\square$.

An advantage of the present coating over certain of those of the prior art is the fact that the second coating is not required to have anisotropic electrical conductivity.

As is apparent from the description above, the first ICP and the second ICP can be the same type of material. For example, both the first ICP and the second ICP can be PEDOT-PSS. Optionally, the first ICP and the second ICP can be different materials.

Furthermore, as discussed above, the transparent first binder polymer can be the same as or different than the transparent second binder polymer. It is sometimes preferred that the same type of binder polymer is used in both layers in order to facilitate adhesion between the two layers. When the same type of polymer is used in both layers, it is preferred that the formulation for the second layer provide a harder and more durable and abrasion resistant surface when cured than the formulation for the first layer.

The present coating is typically from about 3 to about 8 microns in thickness, and is commonly about 4 to 6 microns thick.

The present coating is also capable of rapidly discharging an electrostatic charge. As discussed below, the discharge characteristics of the coating can be measured and reported as electrostatic dissipation decay time ("ESD decay time", or "ESD time") by placing a sample of a coated substrate with the coating side down on a Monroe 268A Charge Plate Analyzer, with one corner hanging over the edge of the charge plate. When the sample is charged to ~1100V, the analyzer is set to Decay (high voltage OFF), and a ground wire is clamped to the coating. The time that it takes for the charge on the sample to decay from 1000V to 100V (in seconds) is recorded as the ESD decay time. It is preferred that the coating have an ESD decay time of 2 seconds or less for aircraft canopy coating applications, and 1 second or less is even more preferred.

As mentioned above, the present coating can be used on any surface that would benefit from having a coating capable of discharging an electrostatic charge.

The following examples describe preferred embodiments of the invention. Other embodiments within the scope of the claims herein will be apparent to one skilled in the art from consideration of the specification or practice of the invention as disclosed herein. It is intended that the specification, together with the examples, be considered to be exemplary only, with the scope and spirit of the invention being indicated by the claims which follow the examples. In the examples all percentages are given on a weight basis unless otherwise indicated.

General Procedures

Coating of Test Coupons:

Spin-Coat Preparation of Test Panels: Samples were coated using a Brewer Science CEE Model 100CB spin-coater. Substrates were typically 3"×3" squares of 0.030" polycarbonate (9000 RowTec polycarbonate, Rowland Technologies Inc., supplied by Multi-Plastics, Inc.) with no additional surface treatment. In addition, 0.25-inch thick cast acrylic and stretched acrylic substrates were also used for test panels. Coating conditions were typically were 30 seconds at 500 rpm for the first layer coating and varied from 10-30 seconds at an RPM range of 500-2000 for the second layer coating. After application of the first layer coating, the samples were placed in a convection oven (Fisher Isotemp model 737G) and dried at 10° C. for 5 minutes. When UV-cured second layer coating formulations were used, after application of the second layer coating, that layer was dried at 10° C. for 2 minutes and then cured in the laboratory bench-top Fusion UV unit.

Flow-Coat Preparation of Coated Test Panels: Substrates were typically 3.6-inch×3.6-inch squares of 0.030-inch thick polycarbonate (9000 RowTec polycarbonate, Rowland Technologies Inc., supplied by Multi-Plastics, Inc.) with no additional surface treatment. In addition, 0.25-inch thick cast acrylic and stretched acrylic substrates, typically 4"×4" in size, were also used for test panels. The substrates were coated using laboratory flow-coat techniques. This method used either a pipette or beaker to dispense or pour the wet coating onto the substrate. The sample is held at an angle position where the surface to be coated is at an angle that is about 5-10 degrees away from normal and is at an incline relative to the horizontal bench top surface. The application is started at a lower corner and slowly progresses vertically along the side edge of the panel. Once the coating reaches the top of the panel, the application is continued by slowly proceeding horizontally across the top edge. It is ideal to allow the wet coating to "sheet-down" or continuously cover the substrate surface. After reaching the opposite the edge, the application proceeds vertically down the other side edge.

Thermal-cured Bottom Coat: panels placed into a 90° C. oven for 15 minutes.

Thermal-cured Topcoat: panel placed into a 90° C. oven for 60 minutes.

UV-cured Bottom Coat: panels placed in a 90° C. oven for 15 minutes followed by 6 seconds of "H" bulb radiation.

UV-cured TopCoat: panels placed in a 90° C. oven for 15 minutes followed by 12 seconds of "H" bulb radiation.

Testing of Coating Performance:

Measurement of coating resistance and ESD decay times: For resistance measurements, parallel silver bar contacts were screen printed onto the surface of the second layer using silver ink and a 305 mesh screen, followed by drying at 100° C. for 5 minutes. For electrostatic dissipation (ESD) decay time measurements, the sample was placed coating-side down on a Monroe 268A Charge Plate Analyzer, with one corner hanging over the edge of the charge plate. Once the sample was charged to ~1100V, the analyzer was set to Decay (high voltage OFF), and a ground wire was clamped to the coating. The analyzer timed the decay from ~1000V to 100V in seconds; a decay time of 2 seconds or less was acceptable for canopy coating performance.

Light Transmission of Coated Test Panels: The percent of light transmission at the 800 nm, 600 nm, and/or 400 nm wavelengths was measured using a Shimadzu UV-1650 UV-Vis spectrophotometer. Uncoated substrate was used in the reference beam and coated test panels in the sample beam.

Fingernail flick: Mar resistance was determined by flicking the surface of the coating with a fingernail and rating the extent of marring imparted to the coating. The method rated the extent of marring on a qualitative basis, ranging from excellent (no mar) to very poor (excessive marring). The fingernail flick simulated the performance of coatings in the Bayer abrasion test. The flick test was also used as a guide for determining the number of passes through the Fusion UV needed for adequate cure when radiation cured binder polymers were used. Test panels were repeatedly processed through the UV cure unit until the second layer showed no worse than very slight marring in the flick test. Usually second layer coatings required three passes through the UV unit to achieve good mar resistance.

Fusion UV Curing Unit: For UV-cured coatings, a laboratory bench top UV curing unit supplied by Fusion UV Systems was used for curing the coatings. The conveyor unit was a model number LC 6B that had an "H" bulb and the power source was supplied by Fusion's UV Power Supply unit P300MT. The conveyor speed could be varied from 15-200 feet per minute.

Q-Sun Weathering Exposure Tests: ASTM G 55 was used as a guideline for the Q-Sun test. The test conditions were "constant noon" (0.68 W/m$^2$ at 340 nm), 50° C. black panel temperature, 40° C. air temperature and 25% relative humidity. The tests were usually run for 300 hours.

Example 1

This illustrates the preparation of a first layer coating formulation using PEDOT-PSS in a thermally cured binder polymer.

Four premixed solutions were prepared as follows:

Solution A: Rhoplex® HA-16 (13.6 gm; 45.2% solids, self-crosslinking acrylic emulsion, available from Rohm and Hass Company, Philadelphia, Pa.) was added slowly with agitation by an electric stirring paddle to 41.4 gm of deionized water by flowing slowly down the side of the beaker containing the water and allowed to mix until a homogeneous solution was obtained.

Solution B: Butyl cellosolve (24 gm; 2-butoxyethanol) and diethylene glycol butyl ether (12 gm; 99.5% reagent grade) were added slowly to 60 gm deionized water in a beaker with agitation by an electric stirring paddle until the components were homogeneously mixed.

Solution C: Baytron® P HC V4 (196 gm; 1% to 1.4% by weight aqueous dispersion of poly(3,4-ethylenedioxythiophene) poly(styrenesulfonate), available commercially from H. C. Starck, Newton, Mass.) and diethylene glycol (9.8 gm; 99% reagent grade) were slowly added to 76 gm of deionized water in a beaker with stirring until a homogeneous mixture was formed.

Solution D: Dynol™ 604 (0.4 gm; surfactant available from Air Products and Chemicals, Inc., Allentown, Pa.) was intermixed with butyl cellosolve (1.2 gm; 2-butoxyethanol) until homogeneous.

To form the first layer formulation, Solution C was slowly stirred while Solution A, Solution B, and Solution D were slowly added. The formulation was allowed to mix until a homogenous mixture was formed. The first layer formulation was then ready for application and curing as discussed above.

The first layer formulation contained about 28% ICP by weight as a percent of solids.

Example 2

This illustrates the preparation of a first layer coating formulation using PEDOT-PSS in a radiation cured binder polymer.

Four premixed solutions were prepared as follows:

Solution A: Rhoplex® HA-16 (1.75 gm; 45.2% solids, self-crosslinking acrylic emulsion, available from Rohm and Hass Company, Philadelphia, Pa.) was added slowly with agitation by an electric stirring paddle to 5.32 gm of deionized water by flowing slowly down the side of the beaker containing the water and allowed to mix until a homogeneous solution was obtained.

Solution B: Butyl cellosolve (3.07 gm; 2-butoxyethanol) and diethylene glycol butyl ether (1.52 gm; 99.5% reagent grade) were added slowly to 7.68 gm deionized water in a beaker with agitation by an electric stirring paddle until the components were homogeneously mixed.

Solution C: Baytron® P HC V4 (25.06 gm; 1% to 1.4% by weight aqueous dispersion of poly(3,4-ethylenedioxythiophene) poly(styrenesulfonate), available commercially from H. C. Starck, Newton, Mass.) and diethylene glycol (1.26 gm; 99% reagent grade) were slowly added to 9.73 gm of deionized water in a beaker with stirring until a homogeneous mixture was formed.

Solution D: Dynol™ 604 (0.0505 gm; surfactant available from Air Products and Chemicals, Inc., Allentown, Pa.) was intermixed with butyl cellosolve (0.1605 gm; 2-butoxyethanol) until homogeneous. To form the first layer formulation, Solution C was slowly stirred while Solution A, Solution B, Solution D, NeoRad R-440 (4.69 gm; 40% solids; acrylic polyurethane emulsion, available from DSM NeoResins, Waalwijk, The Netherlands), SR415 (0.35 gm; ethoxylated trimethylolpropane triacrylate, available from Sartomer, Exton, Pa.), FC4430 (0.35 gm; non-ionic polymeric fluorosurfactant, 15% by weight solids in n-propanol, available from Acota Limited, Shrewsbury, UK), and 25.42 gm of a water/co-solvent mixture (the water/co-solvent mixture includes 79.4% water, 10.8% butyl cellosolve (2-butoxyethanol), 5.4% diethylene glycol butyl ether, and 4.4% diethylene glycol, all in percent by weight) were slowly added. The formulation was allowed to mix until a homogenous mixture was formed. The first layer formulation was then ready for application and curing by application of UV radiation as discussed above.

The first layer formulation contained about 9.4% ICP by weight as a percent of solids.

Example 3

This illustrates the preparation and application of a second layer coating formulation using PEDOT-PSS in a radiation cured binder polymer.

Four premixed solutions were prepared as follows:

Solution A: Rhoplex® HA-16 (1.19 gm; 45.2% solids, self-crosslinking acrylic emulsion, available from Rohm and Hass Company, Philadelphia, Pa.) was added slowly with agitation by an electric stirring paddle to 3.63 gm of deionized water by flowing slowly down the side of the beaker containing the water and allowed to mix until a homogeneous solution was obtained.

Solution B: Butyl cellosolve (2.1 gm; 2-butoxyethanol) and diethylene glycol butyl ether (1.05 gm; 99.5% reagent grade) were added slowly to 5.25 gm deionized water in a beaker with agitation by an electric stirring paddle until the components were homogeneously mixed.

Solution C: Baytron® P HC V4 (17.15 gm; 1% to 1.4% by weight aqueous dispersion of poly(3,4-ethylenedioxythiophene) poly(styrenesulfonate), available commercially from H. C. Starck, Newton, Mass.) and diethylene glycol (0.86 gm; 99% reagent grade) were slowly added to 6.65 gm of deionized water in a beaker with stirring until a homogeneous mixture was formed.

Solution D: Dynol™ 604 (0.035 gm; surfactant available from Air Products and Chemicals, Inc., Allentown, Pa.) was intermixed with butyl cellosolve (0.105 gm; 2-butoxyethanol) until homogeneous. To form the second layer formulation, Solution C was slowly stirred while Solution A, Solution B, Solution D, NeoRad R-440 (9.38 gm; 40% solids; acrylic polyurethane emulsion, available from DSM NeoResins, Waalwijk, The Netherlands), SR415 (0.7 gm; ethoxylated trimethylolpropane triacrylate, available from Sartomer, Exton, Pa.), FC4430 (0.7 gm; non-ionic polymeric fluorosurfactant, 15% by weight solids in n-propanol, available from Acota Limited, Shrewsbury, UK), and 9.76 gm of a water/co-solvent mixture (79.4% water, 10.8% butyl cellosolve (2-butoxyethanol), 5.4% diethylene glycol butyl ether, and 4.4% diethylene glycol, all in percent by weight) were slowly added. The formulation was allowed to mix until a homogenous mixture was formed. The second layer formulation was then ready for application and curing by application of UV radiation as discussed above.

The second layer formulation contained about 4.2% ICP by weight as a percent of solids.

Example 4

This illustrates the production and properties of several embodiments of a first layer of a coating of the present invention.

Formulation of First Layer Coating:

A first layer formulation was prepared as described in Example 1, above, and applied to a polycarbonate test coupon by flow coating as described in the General Procedures. The first layer was thermally cured in an oven set at 90° C. for 15 minutes.

Alternative First Layer Coating Formulation:

In order to increase light transmission, a first layer formulation that used Baytron® PH500 (available from H. C. Stark) instead of Baytron® P HCV4 was evaluated for improvement in light transmission. The PH500 dispersion is a smaller particle size version of the HCV4 product. A first layer coating formulation made with the smaller particle size PH500 resulted in lower viscosity than one prepared with HCV4. When applied in a similar fashion, the lower viscosity material led to lower film thickness and improved light transmission compared to a higher viscosity coating.

Table I compares the light transmission of two-layer coatings having different first layer compositions. The same 20% total solids thermal-cured topcoat (GK34-52) was applied over each bottom coat.

TABLE I

Light transmission of 0.030-inch polycarbonate panels prepared with the PH500 first layer compared to those prepared with the HCV4 version

| PEDOT First layer version, flow coated Flow coat, thermal cured topcoat | PH500 version Thermal cured topcoat, 20% solids (GK34-52) | HCV4 version Thermal cured topcoat, 20% solids (GK34-52) |
|---|---|---|
| % transmission at | | |
| 800 nm | 63.4 | 53.7 |
| 600 nm | 89.2 | 80.0 |
| 400 nm | 75.6 | 71.4 |
| ESD decay time, sec. | 0.1 | 0.1 |
| Cross-hatch adhesion | Excellent (5B) | Excellent (5B) |

Panels containing the PH500 first layer coating exhibited better light transmission than those prepared with HCV4 version. This suggested that light transmission can be manipulated to some extent by the type of PEDOT-PSS dispersion used in the first layer coating.

Example 5

This illustrates embodiments of water-borne radiation cured second layer coatings of the present invention.

Flow Coated Water-Borne, UV-Cured, PEDOT-PSS Topcoats:

Previously, water-borne formulations consisting of a UV-curable aliphatic urethane dispersion (an acrylic emulsion available as NeoRad R440 from NeoResins) and aqueous PEDOT-PSS dispersion were developed as a way to incorporate the PEDOT conductive component into a second layer coating. These formulations were made for spin coat application. Test panels of one of these topcoats (formula GK34-44) applied to the conductive first layer showed good performance. The GK34-44 formula has a total solids level of about 16%. For flow coat applications, second layer coatings with low total solids typically show the better overall performance, especially for light transmission and electrostatic dissipation (ESD). The better light transmission and ESD decay times are thought to be due to the thinner coat that develops when flow coating a lower solids formulation. FIG. 1 shows the effect of second layer thickness, for a moderately conductive second layer formulation applied to a relatively highly conductive first layer, on the ESD properties of a two-coat system.

A variation of formula GK34-44 that had the total solids lowered to about 12% was evaluated for canopy applications. A comparison of this lower solids formula, GK34-67, to the earlier 16% solids formula is shown in Table II. The second layer coatings were evaluated in combination with a first layer; the 16% solids second layer formula was spin applied and the 12% solids second layer formulation was flow coat applied. Both second layers were applied over a hybrid first layer that consisted of equal parts HCV4 and PH500 PEDOT-PSS dispersions. Because of its lower viscosity, the hybrid first layer resulted in thinner coatings and higher light transmission than systems that use first layers made with only HCV4. The hybrid first layer was flow coat applied.

TABLE II

Comparison of coating properties with different water-borne, UV-curable second layer formulations.

| Second layer formulation | % total solids | Application | Bake | % light transmission at 600 nm | Avg ESD Decay Time, sec. | Appearance |
|---|---|---|---|---|---|---|
| GK34-44 | 16 | Spin, 30 sec. at 500 RPM | 5 min at 90° C. | 82 | 0.1 | Excellent, no haze |
| GK34-67 | 12 | Flow, 5 min. drain time | 5 min at 90° C. | 78 | 0.1 | Excellent, no haze |

No significant differences were observed between the two water-borne topcoats when evaluated for light transmission, decay time and appearance.

All references cited in this specification, including without limitation all papers, publications, patents, patent applications, presentations, texts, reports, manuscripts, brochures, books, internet postings, journal articles, periodicals, and the like, are hereby incorporated by reference into this specification in their entireties. The discussion of the references herein is intended merely to summarize the assertions made by their authors and no admission is made that any reference constitutes prior art. Applicants reserve the right to challenge the accuracy and pertinency of the cited references.

In view of the above, it will be seen that the several advantages of the invention are achieved and other advantageous results obtained.

As various changes could be made in the above methods and compositions by those of ordinary skill in the art without departing from the scope of the invention, it is intended that all matter contained in the above description and shown in the accompanying drawings shall be interpreted as illustrative and not in a limiting sense. In addition it should be understood that aspects of the various embodiments may be interchanged both in whole or in part.

The invention claimed is:

1. A transparent two-layer electrostatic dissipating coating comprising:
    a first layer comprising a transparent first binder polymer and a first intrinsically conducting polymer (ICP) in an amount sufficient to provide the first layer with a surface resistance of from about $10^3$ to about $10^5 \Omega/\square$; and
    a second layer in direct contact with the first layer and comprising a transparent second binder polymer and a second ICP in an amount sufficient to provide the second layer with a surface resistance of from about $10^6$ to about $10^{10} \Omega/\square$, wherein the coating has a light transmission of at least about 70% at a wavelength of 600 nm.

2. The coating according to claim 1, wherein the first binder polymer and the second binder polymer are water soluble or water dispersible prior to curing.

3. The coating according to claim 1, wherein the first layer has a thickness of from about 0.5 to about 2 microns.

4. The coating according to claim 1, wherein the first intrinsically conducting polymer comprises a polymer selected from the group consisting of polyaniline, polypyrrole, and polythiophene.

5. The coating according to claim 1, wherein the first intrinsically conducting polymer comprises poly(3,4-ethylenedioxythiophene) poly(styrene sulfonate).

6. The coating according to claim 1, wherein the first binder is selected from a group consisting of a thermally cured polymer and a radiation cured polymer.

7. The coating according to claim 6, wherein the first binder polymer comprises a thermally cured self-crosslinking acrylic.

8. The coating according to claim 1, wherein the second layer has a thickness of from about 2 to about 10 microns.

9. The coating according to claim 1, wherein the second intrinsically conducting polymer comprises a polymer selected from the group consisting of polyaniline, polypyrrole, and polythiophene.

10. The coating according to claim 1, wherein the second intrinsically conducting polymer comprises poly(3,4-ethylenedioxythiophene) poly(styrene sulfonate).

11. The coating according to claim 4, wherein the second binder polymer comprises a material selected from the group consisting of UV-curable vinyl ether/cycloaliphatic epoxides and self-crosslinking acrylic resins.

12. The coating according to claim 1, wherein the second layer comprises a self-crosslinking acrylic resin, poly(3,4-ethylenedioxythiophene) poly(styrenesulfonate), an acrylic polyurethane, and an ethoxylated trimethylolpropane triacrylate.

13. The coating according to claim 1, wherein the coating has a light transmission of at least about 85% at a wavelength of 600 nm.

14. The coating according to claim 1, wherein the thickness of the first layer plus the thickness of the second layer is between about 3 microns and 12 microns.

15. The coating according to claim 1, wherein the amount of the first ICP and the thickness of the first layer and the amount of the second ICP and the thickness of the second layer are designed to provide the coating with an ESD decay time of less than about 2 seconds.

16. The coating according to claim 15, comprising a first layer having a thickness of from about 0.2 microns to about 5 micron which includes from about 8% to about 20% of poly(3,4-ethylenedioxythiophene) poly(styrene sulfonate) by weight in a polyurethane polyacrylate cobinder polymer; and a second layer having a thickness of from about 2 microns to about 10 microns which includes from about 2% to about 12% of poly(3,4-ethylenedioxythiophene) poly(styrene sulfonate) by weight in a polyurethane polyacrylate cobinder polymer.

17. The coating according to claim 15, comprising a first layer having a thickness of from about 0.5 microns to about 1 micron which includes from about 8% to about 12% of poly(3,4-ethylenedioxythiophene) poly(styrene sulfonate) by weight in a polyurethane polyacrylate cobinder polymer; and a second layer having a thickness of from about 5 microns to about 8 microns which includes from about 3% to about 5% of poly(3,4-ethylenedioxythiophene) poly(styrene sulfonate) by weight in a polyurethane polyacrylate cobinder polymer.

18. The coating according to claim 17, wherein the light transmission at 800 nm of the coating is at least about 85%.

19. A transparent substrate having protection against accumulation of electrostatic charge, comprising:
a surface of the substrate, to which is adhered a coating comprising;
a first layer comprising a transparent first binder polymer and a first intrinsically conducting polymer (ICP) in an amount sufficient to provide the first layer with a surface resistance of from about $10^3$ to about $10^5 \Omega/\square$; and
a second layer in direct contact with the first layer and comprising a transparent second binder polymer and a second ICP in an amount sufficient to provide the second layer with a surface resistance of from about $10^6$ to about $10^{10} \Omega/\square$,
wherein the coating has a light transmission of at least about 70% at a wavelength of 600 nm.

20. The substrate according to claim 19, wherein the substrate is an aircraft canopy.

21. A method of making a transparent two-layer electrostatic dissipating coating on a surface of a substrate comprising:
forming on the surface a first layer comprising a transparent first binder polymer and a first intrinsically conducting polymer (ICP) in an amount sufficient to provide the first layer with a surface resistance of from about $10^3$ to about $10^5 \Omega/\square$; and
forming a second layer on the first layer and in direct contact with the first layer and comprising a transparent second binder polymer and a second ICP in an amount sufficient to provide the second layer with a surface resistance of from about $10^6$ to about $10^{10} \Omega/\square$,
wherein the coating has a light transmission of at least about 70% at a wavelength of 600 nm.

22. The method according to claim 21, wherein the step of forming the first layer comprises
providing a first layer formulation comprising an aqueous dispersion of poly(ethylenedioxythiophene) poly(styrene sulfonate) and a transparent first binder polymer;
applying a continuous film of the first layer formulation to the surface; and
curing the first layer formulation to form a first layer having a thickness of from about 0.5 microns to about 1 micron and in which the poly(ethylenedioxythiophene) poly(styrene sulfonate) is present in an amount of between about 9% to about 15% by weight of the cured layer.

23. The method according to claim 21, wherein the step of forming the second layer comprises
providing a second layer formulation comprising an aqueous dispersion of poly(ethylenedioxythiophene) poly(styrene sulfonate) and a transparent second binder polymer;
applying a continuous film of the second layer formulation over the first layer; and
curing the second layer formulation to form a second layer having a thickness of from about 3 microns to about 5 microns and in which the poly(ethylenedioxythiophene) poly(styrene sulfonate) is present in an amount of between about 3% to about 10% by weight of the cured layer.

24. A method of dissipating electrostatic charge from a transparent substrate, the method comprising applying to a surface of the substrate a transparent two-layer electrostatic dissipating coating comprising:

a first layer comprising a transparent first binder polymer and a first intrinsically conducting polymer (ICP) in an amount sufficient to provide the first layer with a surface resistance of from about $10^3$ to about $10^5 \Omega/\square$; and a second layer in direct contact with the first layer and comprising a transparent second binder polymer and a second ICP in an amount sufficient to provide the second layer with a surface resistance of from about $10^6$ to about $10^{10} \Omega/\square$, wherein the coating has a light transmission of at least about 70% at a wavelength of 600 nm.

* * * * *

UNITED STATES PATENT AND TRADEMARK OFFICE
CERTIFICATE OF CORRECTION

PATENT NO.        : 7,749,603 B2                                                                 Page 1 of 1
APPLICATION NO.   : 12/069457
DATED             : July 6, 2010
INVENTOR(S)       : Charles R. Graham, Patrick J. Kinlen and Tony D. Flaim It is certified that error appears in the above-identified patent and that said Letters Patent is hereby corrected as shown below:

Column 4, Line 29, replace the term "eve" with the term -- even --.
    Column 9, Line 49, replace the term "10°C" with the term -- 100°C --.
    Column 9, Line 51, replace the term "10°C" with the term -- 100°C --.
    Column 10, Line 55, replace the term "ASTM G 55" with the term -- ASTM G155 --.

Signed and Sealed this

Sixteenth Day of November, 2010

David J. Kappos
*Director of the United States Patent and Trademark Office*